United States Patent [19]

McDevitt et al.

[11] Patent Number: 5,591,696

[45] Date of Patent: Jan. 7, 1997

[54] CHEMICALLY TAILORED CORROSION RESISTANT HIGH-$T_C$ SUPERCONDUCTORS

[75] Inventors: John T. McDevitt; Ji-Ping Zhou; Jianai Zhao, all of Austin, Tex.

[73] Assignee: Board of Regents, The University of Texas System, Austin, Tex.

[21] Appl. No.: 320,012

[22] Filed: Oct. 6, 1994

[51] Int. Cl.$^6$ .................... C04B 35/505; C04B 35/622; B32B 18/00
[52] U.S. Cl. .................... 505/234; 505/434; 505/780; 252/521; 428/375; 428/403
[58] Field of Search .................... 505/126, 234, 505/434, 725, 726, 780, 781; 252/518, 521; 428/375, 403

[56] References Cited

U.S. PATENT DOCUMENTS

| | | | |
|---|---|---|---|
| 5,124,310 | 6/1992 | Ovshinsky et al. | 505/1 |
| 5,130,295 | 7/1992 | Labib | 505/234 |
| 5,212,151 | 5/1993 | Takano et al. | 505/1 |
| 5,212,152 | 5/1993 | Lyon et al. | 505/1 |
| 5,229,358 | 7/1993 | Kumar | 505/1 |
| 5,264,412 | 11/1993 | Ota et al. | 505/1 |
| 5,272,133 | 12/1993 | Josefowicz et al. | 505/1 |
| 5,288,697 | 2/1994 | Schrepp et al. | 505/1 |
| 5,502,029 | 3/1996 | Doi et al. | 505/234 |

FOREIGN PATENT DOCUMENTS

| | | | |
|---|---|---|---|
| 624663 | 11/1994 | European Pat. Off. | 505/234 |

OTHER PUBLICATIONS

Matsumoto et al "Superconducting $Y_{1-x}L_xBa_{2-y}M_yCu_{3-z}N_zO_\delta$ System . . . " Mater. Res. Bull. vol. 23, No. 9, Aug. 1988 pp. 1241–1246.

Bansal, N. P., "Chemical Stability of High–Temperature Superconductors," NASA Technical Memorandum 105391, Feb. 1992.

Bansal and Sandkuhl, "Chemical durability of high–temperature superconductor $YBa_2Cu_3O_{7-x}$ in aqueous environments," *Appl Phys Lett* 52(4):323–325, Jan. 1988.

Barkatt et al., "Corrosion of Ceramic Superconductors: An Overview," *Corrosion of Glass, Ceramics and Ceramic Superconductors,* Ch. 19, pp. 548–582, 1992.

Barns and Laudise, "Stability of superconducting $YBa_2Cu_3O_7$ in the presence of water," *Appl Phys Lett* 51(17):1373–1375, Oct. 26, 1987.

Chaudhari et al., "Inhibition of aqueous degradation of $Y_1Ba_2Cu_3O_{7-x}$ high–$T_c$ superconductor by nitrogen ion implantation," *J Appl Phys,* 66(9):4509–4511, Nov. 1, 1989.

DeGuire et al., "Thermosetting epoxy as a moisture–resistant coating for $YBa_2Cu_3O_7$," *J Materials Sci,* 25:2881–2885, 1990.

Ichikawa et al., "Effect of Overcoating with Dielectric Films on the Superconductive Properties of the High–$T_c$ Y–Ba–Cu–O Films," *Japanese Journal of Applied Physics Part 2—Letters,* 27(3):L381–L383, 1988.

Jia and Anderson, "Characterization of hydrofluoric acid treated Y–Ba–Cu–O oxides," *J. Mater. Res.,* 4(6):1320–1325, 1989.

(List continued on next page.)

*Primary Examiner*—Paul Lieberman
*Assistant Examiner*—M. Kopec
*Attorney, Agent, or Firm*—Arnold, White & Durkee

[57] ABSTRACT

A corrosion resistant high temperature superconductor and a method of preparing said superconductors involving substitution of ions in the lattice to relieve stress and strain caused by mismatched bond lengths. Specific examples of such superconductors are $Y_{1-y}Ca_yBa_{2-y}La_yCu_3O_{7-d}$ where $0<y<1.0$ and $0<d<1$ and $YBa_{2-y}Sr_yCu_3O_{7-d}$ where $0<y<2$ and $0<d<1$. In $YBa_2Cu_3O_{7-d}$ structure, the internal stresses estimated from the difference between the bond valence sum and the formal oxidation state for Ba and Cu ions indicate that the Ba atom is too large for Cu—O cage at oxygen stoichiometric d=0 and too small at d=1. Therefore, the Ba (1.52 Å) is substituted by La (1.27 Å) and for keeping the same oxidation state of Cu as in the prototype material the Ca (1.12 Å) equivalent to La replaces the Y (1.019 Å).

4 Claims, 7 Drawing Sheets

Komori et al., "Chemical durability of a superconducting oxide $YBa_2Cu_3O_x$ in aqueous solutions of varying pH values," *Journal of Materials Science*, 24:1889–1894, 1989.

Hill et al., "Passivation of high $T_c$ superconductor surfaces with $CaF_2$ and Bi, Al, and Si oxides," *Appl. Phys. Lett.*, 53(17):1657–1659, 1988 Oct.

McDevitt et al., "Electrochemistry at $YBa_2Cu_3O_7$ Superconductor Electrodes at Temperatures Above $T_c$," *J. Electroanal. Chem.*, 243:465–474, 1988.

Meyer et al., "Reactivity and passivation for Bi adatoms on $YBa_2Cu_3O_{6.9}$ and $Bi_2Ca_{1+x}Sr_{2-x}Cu_2O_{8+y}$," *Appl. Phys. Lett.*, 53(11):1004–1006, 1988 Sep.

Nagai et al., "Amorphous Fluoropolymer Films for Superconductive Microwave Components Using High-$T_c$ Superconducting Films," *Japanese Journal of Applied Physics*, 30(11A):2751–2755, 1991 Nov.

Reddy et al., "Effective passivation of YBaCuO superconducting bridges by photoresist overlayers," *Cryogenics*, 31:209–211, 1991.

Riley and McDevitt, "Electrochemically assessed corrosion reactivity of $YBa_2Cu_3O_7$ electrodes," *J. Electroanal. Chem.*, 295:373–384, 1990.

Riley et al., "Electrochemical Investigations of Various High-Temperature Superconductor Phases," *Chem. Mater.*, 4:1176–1181, 1992.

Riley et al., "Relative Reactivity Trends of High Temperature Superconductor Phases," *Mat. Res. Soc. Symp. Proc.*, 275:711–716, 1992.

Riley et al., "Environmental Reactivity Characteristics of $K_3C_{60}$ and $YBa_2Cu_3O_{7-x}$ High-Temperature Superconductor Thin Films," *Solid State Communications*, 88(6):431–434, 1993.

Rosamilia et al., "Aqueous Electrochemistry of Cuprate-Based High $T_c$ Superconductors," *Journal of The Electrochemical Society*, 1863–1864, 1987. Jul.

Sato et al., "Stabilization of $Ba_2YCu_3O_{7-\delta}$ by Surface Coating with Plasma Polymerized Fluorocarbon Film," *Japanese Journal of Applied Physics*, 27(11):L2088–L2090, 1988. Nov.

Vasquez et al., "Reduced reactivity to air on HF-Treated $YBa_2Cu_3O_{7-x}$ surfaces," *Appl. Phys. Lett.*, 54(23):2373–2375, 1989. Jun.

Xi et al., "Electric field effect in high $T_c$ superconducting ultrathin $YBa_2Cu_3O_{7-x}$ films," *Appl. Phys. Lett.*, 59(26):3470–3472, 1991. Dec.

Yan et al., "Water interaction with the superconducting $YBa_2Cu_3O_7$ phase," *Appl. Phys. Lett.*, 51(7):532–534, 1987. Aug.

Zhou and McDevitt, "Corrosion Reactions of $YBa_2Cu_3O_{7-x}$ and $Tl_2Ba_2Ca_2Cu_3O_{10+x}$ Superconductor Phases in Aqueous Environments," *Chem. Mater.*, 4:953–959, 1992.

Zhou and McDevitt, "Reaction of the Oxygen-Deficient $YBa_2Cu_3O_6$ Phase with Water," *Solid State Communications*, 86(1):11–14, 1993.

Zhou et al., "Relative Corrosion Reactivity and Surface Microstructure of $YBa_2Cu_3O_{7-x}$ Samples with Different Oxygen Contents," *Chem. Mater.*, 361–365, 1993.

Zhou et al., "Environmental reactivity characteristics of copper-oxide superconductors," *Appl. Phys. Lett.*, 63(4):548–550, 1993. Jul.

Zhou et al., "Chemically Tailored, Corrosion Resistant, High-$T_c$ Phases," *J. Am. Chem. Soc.*, 116(20):9389–9390, 1994, Oct. 5.

Barkatt et al., "Environmental Stability of High $T_c$ Superconducting Ceramics", *MRS Bulletin*, Sep. 1993, pp. 45–52.

Brown, "A Determination of the Oxidation States and Internal Stresses in $Ba_2YCu_3O_{x1}$ X=6–7 Using Bond Valences," *Journal of Solid State Chemistry X2*, 1989, 122–131.

Mannhart et al., "Electric Field Effect on Superconducting $YBa_2Cu_3O_{7-\delta}$ Films," *Z. Phys. B—Condensed Matter*, 83, 1991, pp. 307–311.

McDevitt et al., "Synthesis and Study of Chemically Tailored, Corrosion Resistant High-$T_c$ Phases," *American Chemical Society Spring Meeting*, Mar. 13–17, 1994, Abstract No. 538.

McDevitt et al., "Optical Studies of Dye–Coated Superconductor Junctions," *American Chemical Society Spring Meeting*, Mar. 13–17, 1994, Abstract No. 342.

McDevitt et al., "Conductive Polymer Switch for Controlling Superconductivity," *American Chemical Society Spring Meeting*, Mar. 13–17, 1994, Abstract No. 250.

McDevitt et al., "Fabrication and Study of Hybrid Molecule/Superconductor Assemblies," *American Chemical Society Spring Meeting*, Mar. 13–17, 1994, Abstract No. 190.

McDevitt et al., "Atomic Force Microscopy Studies of Conductive Polymer Structures Grown onto High $T_c$ Superconductor Films," *American Chemical Society Spring Meeting*, Mar. 13–17, 1994, Abstract No. 176.

McDevitt et al., "Fabrication and Study of Molecule/Superconductor Structures and Devices," *American Chemical Society National Meeting*, Aug. 21–25, 1994, Abstract No. 185.

McDevitt et al., "Conductive Polymer/Superconductor Bilayer Structures," *American Chemical Society National Meeting*, Aug. 21–25, 1994, Abstract No. 258.

Taguchi, "Effect of Lattice Distortions on 90–K Class Superconductors: $Y_{1-x}Eu_xBa_xCu_3O_{7-\delta}$, $Yb_{1-x}Sm_xBa_2Cu_3O_{7-\delta}$ and $Eu(Ba_{1-x}Sr_x)_2Cu_3O_{7-\delta}$," *Japanese Journal of Applied Physics*, 27(6):L1058–L1060 (1988). Jun.

International Search Report Dated Feb. 29, 1996.

10 μm

3 μm

YBa$_2$Cu$_3$O$_{7-d}$

Y$_{0.6}$Ca$_{0.4}$Ba$_{1.6}$La$_{0.4}$Cu$_3$O$_{7-d}$

CHEMICALLY TAILORED CORROSION RESISTANT HIGH-$T_C$ SUPERCONDUCTORS

The government owns rights in the present invention pursuant to research support from National Science Foundation (Contract # DMR -9221589).

BACKGROUND OF THE INVENTION

1. Field of the Invention

The present invention relates to the production and composition of superconductors that display resistance to environmental corrosion from materials such as water, $CO_2$ and CO as well as chemical damage from photoresist and metal contact pad exposure. The improved chemical stability of these superconductors will enable more reliable processing methods to be exploited in the preparation of useful superconducting elements. The prospects for both thin film devices (Josephson junctions, SQUIDS, microwave devices, interconnects, bolometric sensors, etc.) as well as large scale applications for bulk materials (power transmission lines, superconducting magnets, motors, generators, maglev transportation, SMES, magnetic separators, etc.) are improved substantially with the availability of such stable superconductors.

2. Description of the Related Art

One of the major stumbling blocks that has plagued the practical utilization of high-$T_C$ superconductors has been the tendency of the cuprate compounds to degrade chemically when exposed to water, acids, $CO_2$ and CO. (Zhou, 1992; Zhou, Appl. Phys. Lett. 1993; Barkatt, 1993; Rosamilia, 1987) Of the technologically important superconductors with transition temperatures above 77 K. (i.e. $YBa_2Cu_3O_7$, $Tl_2Ba_2Ca_2Cu_3O_{10}$, $Bi_2Sr_2CaCu_2O_8$ and $HgBa_2Ca_2Cu_3O_9$), $YBa_2Cu_3O_7$ is the preferred material for thin film applications (Black, 1993; Bedekar, 1992; Narita, 1992). Unfortunately, of these cuprate materials, $YBa_2Cu_3O_7$ displays the least corrosion resistance (Zhou, Appl. Phys. Lett. 1993).

Corrosion is a tremendous problem for thin film materials. Bulk superconductors are much less affected because the corrosion typically only attacks a surface layer and then is significantly hindered from reaching beyond that layer, although the entire material will eventually corrode. However, a thin film can not afford to have even a surface layer that is corroded as that will significantly affect its properties. Thus, it becomes imperative to either find a superconducting material that does not corrode or develop a way to protect the existing superconductors from environmental degradation.

There have been several methods suggested for providing protection against chemical damage for the high-Tc superconductor (Barkart, 1993), none of which has been shown to be entirely satisfactory. For superconducting wires, enclosure in a silver tube has been found to be successful in slowing corrosion. Unfortunately, this process does not completely halt degradation. Similar results are found for nitrogen ion implantation.

External protection methods such as coatings have also proven useful. Proposed and implemented coatings include fluoride, polymer, dielectric or fluorocarbon films.

In addition, a sol-gel process has been used to coat superconductors. Addition of $TiO_2$ to such a film has led to improved corrosion resistance, but the critical temperature of the superconductor drops by 5 K. When $TiO_2$ is added no the sol-gel coating, $Ti^{4+}$ can replace $Cu^{3+}$ as both are comparable in size (±15%). It has been suggested that the reduction of $Cu^{3+}$ is a primary factor in the corrosion process. The replacement of $Ti^{4+}$ for $Cu^{3+}$ then decreases the copper concentration near the surface and is thought to reduce the opportunity for corrosion.

However, it has been shown that $YBa_2Cu_3O_{7-d}$ (0<d<1) materials having intermediate oxygen contents corrode more slowly than do samples with either higher or lower oxygen contents (Zhou, Chem. Mater. 1993; Zhou, Solid State Comm. 1993). This behavior cannot be explained satisfactorily along the lines of copper oxidation levels. No other current theories adequately explain the corrosion mechanism. Without such a theory, any attempt at protecting the superconductors may not address the root of the problem.

Thus, all previous methods involved trying to protect superconducting material from the corrosive reactants through the formation of protective barriers. An alternate route is to find a superconducting material that is naturally resistant to corrosion. Such a corrosion resistant substance would have the advantage of avoiding extra steps involved in adding the protective element. The superconductor would also have a more flexible utility as no extra materials would be required that could hinder a particular use. Perhaps even more important is the fact that a more stable superconductor material will allow for easier processing of high-Tc products and devices. Currently, materials limitations have made it difficult to develop processing methods that can be exploited successfully for the preparation of useful superconductor thin film devices. Consequently, even short exposure to the atmosphere have been shown to cause significant amount of surface corrosion. This adverse chemical reactivity has been one of the most problematic issues that has slowed progress in the development of high-Tc thin film devices and sensors. The availability of stable superconductor surfaces will open new avenues for thin film processing and make it easier to establish electrical contact to the surface of a superconductor element. Moreover, the lifetime and reliability of superconductor elements will be effectively increased with the availability of these stable materials.

SUMMARY OF THE INVENTION

An object of this invention is to provide a method for preparing high temperature superconducting compounds that are corrosion resistant. In order to best accomplish this objective, it is desirable to understand why and how corrosion takes place. The present invention also concerns compositions of matter which are superconducting and resistant to degradation by water, carbon dioxide, carbon monoxide, metal contact layers, substrates, buffer layers and photoresists. Such compositions are, for example $Y_{1-y}Ca_yBa_{2-y}La_yCu_3O_{7-d}$ or $YBa_{2-y}Sr_yCu_3O_{7-d}$ where 0<y<1 and 0<d<1. Such compositions may, in and of themselves, be utilized in bulk or may be used as thin films. A layer of corrosion resistant superconductors may be used to encapsulate a chemically more reactive superconductor either in bulk ceramic or thin film form. An important aspect of the present invention is a high temperature superconductor whose lattice strains have been lessened, thereby conferring corrosion resistance.

An important aspect of the present invention is a composition of matter comprising $Y_{1-x}Ca_xBa_{2-y}La_yCu_3O_{7-d}$ where x and y are from about 0.1 to about 1.0 and d is 1 or less than 1. X and y are preferably from about 0.1 to about 0.4 and d is 1 or less than 1, x and y are more preferably from 0.3 to 0.4. D is preferably 0.03 to 1.00.

Another important aspect of the present invention is a composition of matter comprising $YBa_{2-y}Sr_yCu_3O_{7-d}$ where y is about 0.1 to about 0.6 and d is 1 or less than 1. Here x and y are preferably 0.4 to 0.6 and most preferably 0.6.

The present invention comprises a method of preparing thin films of corrosion resistant superconductor comprising forming a film of $Y_{1-x}Ca_xBa_{2-y}La_yCu_3O_{7-d}$ or $YBa_{2-y}Sr_yCu_3O_{7-d}$ where x and y are from about 0.1 to about 0.6 and d is less than 1.

Yet another aspect of the present invention is a method of preparing a layer of corrosion resistant superconductor surrounding a bulk superconductor comprising forming on a $YBa_2CuO_{7-d}$ bulk a layer of $Y_{1-y}Ca_yBa_{2-y}La_yCu_3O_{7-d}$ or $YBa_{2-y}Sr_yCu_3O_{7-d}$ where x and y are from about 0.1 to about 0.6 and d is less than 1.

More generally, in one view, the present invention includes a composition of matter comprising a derivative of a known high temperature $YBa_2CuO_{7-d}$ superconductor where a portion of one or more of Y, Ba and Cu atoms has been replaced by atoms of a different size to decrease stress the superconductor's crystalline lattice, thereby conferring corrosion resistance.

The present invention includes a method for preparing a high temperature superconductor stable to atmospheric components, the method comprising partially substituting atoms of the superconductor to reduce superconductor lattice strain by at least 50% and stabilized high temperature superconductor formed by this method.

Also included herein is a process for producing chemically stable bulk ceramic and thin film forms of a RE $Ba_2Cu_3O_{7-d}$ superconductor, the method comprising substituting cations of a different ionic size for a portion of at least one of the RE, Ba or Cu so that lattice strain is decreased by at least 50%; wherein RE is La, Ce, Pr, Nd, Pm, Sm, Em, Gd, Tb, Dy, Ho, Er, Tm, Yb, Lu or Y.

In this process the superconductor is preferably $Y_{1-x}Ca_xBa_{2-y}La_yCu_3O_{7-d}$ where x is from about 0.01 to about 0.6, y is from about 0.01 to about 0.6 and d is 1 or less than 1; or $YBa_{2-x}Sr_xCu_3O_{7-d}$ where x is from about 0.01 to about 1.8 and d is 1 or less than 1. More preferably RE is Y and is partially replaced with a lanthanide or actinide ion.

The present invention importantly involves a process for determining corrosion-resistant $YBa_2Cu_3O_{7-d}$ superconductor variants in which partial cation substitutions for at least one of Y, Ba and Cu are completed to an extent relieving internal lattice stress factors that facilitate rapid $H_2O$, CO or $CO_2$—induced corrosion of the superconductor.

Also described are bulk composite superconducting ceramic materials in which a chemically reactive superconductor is encapsulated with a protective coating of the chemically stabilized material of the present invention.

Chemically stable monolithic thin superconductor films may be produced by the present inventive methods comprising forming a thin film of material formed by the other methods described herein.

According to the present invention bilayer thin film structures in which an inner layer of a reactive superconductor is protected with an outer barrier formed from a chemically stabilized superconductor, the process comprising layering on said inner layer and outer barrier formed are readily produced.

The present invention also includes a process wherein alternating layers of a reactive superconductor are deposited in conjunction with a chemically stabilized superconductor to create a multilayer of superlattice which possesses both good corrosion resistance and superconductive properties, the process comprises forming a layer of superconductor and a layer of the chemically stable superconductor produced by the process of the present methods.

A ceramic RE $Ba_2Cu_3O_{7-d}$ superconductor stable to corrosion by CO, $CO_2$ or $H_2O$ is also part of the present invention where cations of a different ionic size are substituted for a portion of at least one of the RE, Ba or Cu so that lattice strain is decreased by at least 50%; wherein RE is La, Ce, Pr, Nd, Pm, Sm, Em, Gd, Tb, Dy, Ho, Er, Tm, Yb, Lu or Y.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of the specific embodiments presented herein.

FIG. 3a is a monolithic ceramic; FIG. 3b is an encapsulated ceramic; FIG. 3c is a monolithic film; FIG. 3d is an encapsulated (capped) film; and FIG. 3e is a superlattice.

DETAILED DESCRIPTION OF THE PREFERRED EMBODIMENTS

Figure 1:
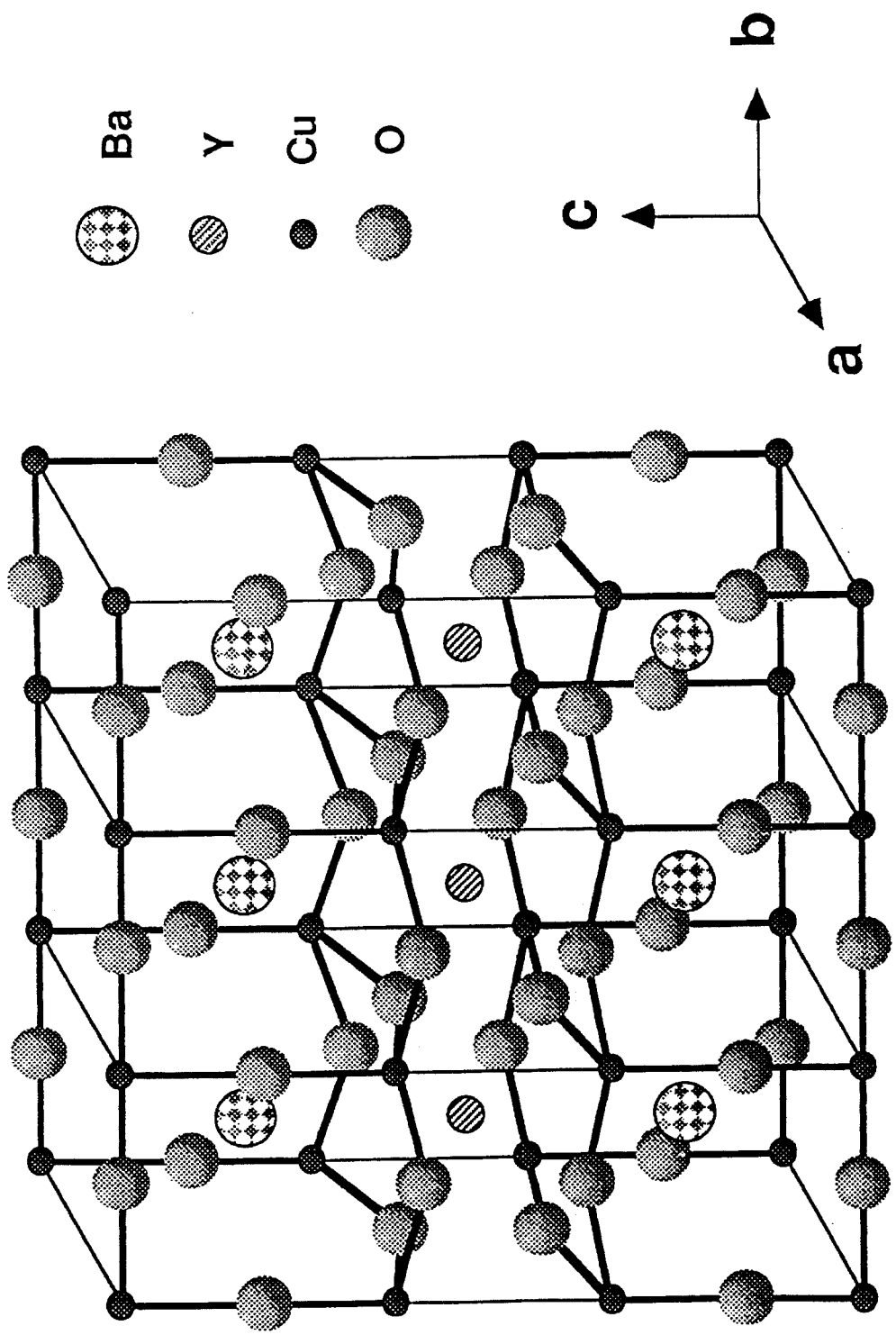
FIG. 1 is a cross-sectional view of the lattice structure of $YBa_2Cu_3O_7$.

In an ionic solid there is natural bond length between the anions and cations. In complex structures such as the layered high-Tc oxide materials, the bonding interactions in one layer can influence those in adjacent layers. Slight mismatching between bond lengths in the various layers can result in the formation of internal stress and strain factors that influence the properties at the solid state material. In simple perovskite materials, the Goldschimdt tolerance factor (or t factor) has been used to estimate the bond length mismatch as well as be exploited as a predictive tool for the synthesis of such materials. In the complex cuprate superconductor materials, a more sophisticated method based on the bond valence sum method is used to explore this issue for such compounds (Brown, 1987).

According to the bond valence model (Brown, 1987), the atomic valence (or oxidation state) of an atom is assumed to be distributed between the bonds that it forms. As a result, the sum of the valence of the bonds formed by any atom is equal to its atomic valence, however, any difference taken place in an atom can be attributed to internal strain and induced stress within the structure. The equations used for calculation of bond valence sum, bond lengths and strains are summarized in Table 1. The bond valence sum of cation (i) is a summation of the bond valence between cation (i) and anion (j). The bond valence ($s_{ij}$) is dependent on the correspondent bond length ($R_{ij}$). The relationship between the bond valence and the relative bond length has been shown to take the form of an exponential function. The results obtained by such calculations are ideal, in other words, the bond lengths are not strained, otherwise they will be not correlated perfectly with bond valences. Since the $YBa_2Cu_3O_{7-d}$ phase with double Cu—O layers is an oxygen-deficient perovskite structure, ignoring the small effect of the $Cu(2)O_2$ sheet puckering is feasible (Brown, 1991). The Ro (the tabulated ionic radius) parameter is obtained from a table of ionic radii such as that provide in Brown, 1985. Values for the mixture of cations are obtained from the weighted average of the constituent ions. For example, in the $Y_{0.6}Ca_{0.4}Ba_{1.6}La_{0.4}Cu_3O_{7-d}$ system, the Ba—La—O bond length is obtained according to the following expression.

$$R_{ij} = \frac{1.6(Ba - O) + 0.4(La - O)}{2}$$

With the use of the values of 2.285 Å for Ba—O and 2.172 Å for La—O, the above formulation yields $R_{ij}$=2.7455 (see Tables 2 and 3). Values of $R_{ij}$ measured can be obtained precisely from neutron diffraction experiments where data is refined to obtain the individual M—O bond lengths. In the absence of such data, approximate values of the average bond length can be obtained from a simple inspection of the lattice parameters as measured by X-ray powder diffraction. For example, $Y_{0.6}Ca_{0.4}Ba_{1.6}La_{0.4}Cu_3O_7$ yields a tetragonal cell an a axis dimension of 3.87 Å. The average of the $(Ba_{1.6}La_{0.4})$—(O) bond length is obtained as $$R_{ij} = \sqrt{2} \ \frac{a}{2} = 2.74$$

In $YBa_2Cu_3O_{7-d}$, the bond valence sum of Ba and the average sum around two Cu ions (Cu(1) and Cu(2)) are found to differ significantly from the formal oxidation state. This difference is found to depend on the oxygen stoichiometry (d). This difference leads to internal strain, indicating that the Ba is too large for the Cu—O framework at d=0 and the same quantity is too small at d=1.

TABLE 1

Equation Sums for Calculation of
Bond Lengths, Strains, and t Factors

| Bond Valence Sum (BVS) | $V_i = \Sigma s_{ij}$<br>$s_{ij} = \exp[(R_o - R_{ij})/B]$<br>$R_{ij} = R_o - B \ln s_{ij}$ | $V_i$ — bond valence sum<br>$s_{ij}$ — bond valence<br>$R_o$ — tabulated bond length (Å)<br>B — constant (0.37)<br>$R_{ij}$ — bond length (Å) |
|---|---|---|
| Difference ΔR | $\Delta R_{ij} = [(a/2)2^{1/2}] - R_{ij}$ | a (or b) — lattice parameters (Å) |
| Strain e (%) | $e = R_{ij}/[(a/2)2^{1/2}]$ | |
| t Factor | $t = (^rBa^{2+} + ^rO^{2-})/$<br>$(^rCu^{2+} + ^rO^{2-})2^{1/2}$ | $^rBa^{2+}, ^rCu^{2+}, \&$<br>$^rO^{2-}$ — ionic radii at room temperature |

TABLE 2

Calculation of Ba(La)—O1 Bond
Lengths, Strains in $Y_{1-y}Ca_yBa_{2-y}La_yCu_3O_7$

| SAMPLE | y = 0.0 | y = 0.1 | y = 0.2 | y = 0.3 | y = 0.4 |
|---|---|---|---|---|---|
| Calculated R (Å) | 2.798 | 2.785 | 2.772 | 2.759 | 2.746 |
| Measured R (Å) | 2.748 | 2.748 | 2.742 | 2.738 | 2.736 |
| Difference ΔR (Å) | −0.050 | −0.037 | −0.030 | −0.021 | −0.010 |
| Strain e (%) | −1.79 | −1.33 | −1.07 | −0.75 | −0.35 |

Note: the parameters $R_o$ are 2.285 Å for Ba—O and 2.172 Å for La—O.

TABLE 3

Valence Sum Excess, Ideal Valence Distributions
and Bond Lengths for $YBa_2Cu_3O_7$ and
$Y_{1-y}Ca_yBa_{2-y}La_yCu_3O_7$

| Valence Ideal | Valence Sum Excess | | Bond Length (Å) | |
|---|---|---|---|---|
| Cu2 = 2.00 | Cu2—O1 | 0.200 | Cu2—O1 | 2.274 |
| | Cu2—O2/3 | 0.450 | Cu2—O2/3 | 1.974 |
| Ba = 2.00 | Ba—O1 | 0.250 | Ba—O1 | 2.798 |
| | Ba—O2/3 | 0.175 | Ba—O2/3 | 2.930 |
| | Ba—O4 | 0.150 | Ba—O4 | 2.987 |
| La = 3.00 | La—O1 | 0.375 | La—O1 | 2.535 |
| | La—O2/3 | 0.265 | La—O2/3 | 2.667 |
| | La—O4 | 0.225 | La—O4 | 2.724 |

Numbers following each ion refer to the site within the lattice as described commonly in the literature.

The $YBa_2Cu_3O_{7-d}$ phase possesses a layered structure with a sequence along the c-axis of $Cu(1)O_x$—BaO—$Cu(2)O_2$—Y—$Cu(2)O_2$—BaO—$Cu(1)O_x$ (FIG. 1) (Capponi, 1987; Jorgensen, 1990). In the $Cu(1)O_x$ layer, oxygen ions are ordered along the b-axis with vacancies existing along the a-axis that form open channels which run parallel to the b-axis. Protic species can penetrate into the lattice via these channels and react with oxygen leading to structural instability (Thompson, 1987). This type of reactivity has been identified by proton NMR studies of high-$T_C$ specimens in the early stages of corrosion (Nishhara, 1988).

In addition, any bond length mismatch between these layers can introduce internal stresses (Brown, 1991; Goodenough, 1991). These lattice stress and strain phenomena appear to be important factors dictating the decomposition kinetics for this material.

In an effort to relieve the tensile stress and strain which exists in the Ba—O and $Cu(2)O_2$ layers in the $YBa_2Cu_3O_{7-d}$ structure, a number of substitution strategies can be considered. In most cases of anion substitutions, a dramatic decrease in $T_C$ is noted and/or the formation of impurities are found (Yarmoshenko, 1993). On the other hand, a family of isostructural materials with rare earth ions substituted into the Y site exhibited only minor changes in $T_C$ for most cases (Hor, 1987). Since there are no oxygen ions in the yttrium layer, the substitutions at this site are expected to result in only modest changes in the internal stresses. However, one skilled in the art could readily use the strategies listed below for achieving bond length matching in combination with changes in the Y component to one of the other rare earth ions. In fact, it has been shown in our laboratory that $Gd_{0.6}Ca_{0.4}Ba_{1.6}La_{0.4}Cu_3O_{7-d}$ can be prepared readily and the material exhibits excellent corrosion resistance. This trivial substitution is recognized here as an effective alternative, but will not be the focus of further discussion. Substitutions that lead to improved bond matching between the Ba—O and the $Cu(2)O_2$ layers and relieve the internal stresses are expected to be more important (Huang, 1992;

Sunshine, 1989; Manthiram, 1988; Manthiram, 1989). Since previous studies have shown that substitutions into the Cu site normally decrease $T_C$ in a dramatic fashion, (Huang, 1992) it is important to realize that chemical substitution at the $Ba^{2+}$ site should be most effective in achieving the objective of maximizing both the resistance to corrosion as well as the superconducting properties.

Figure 2:
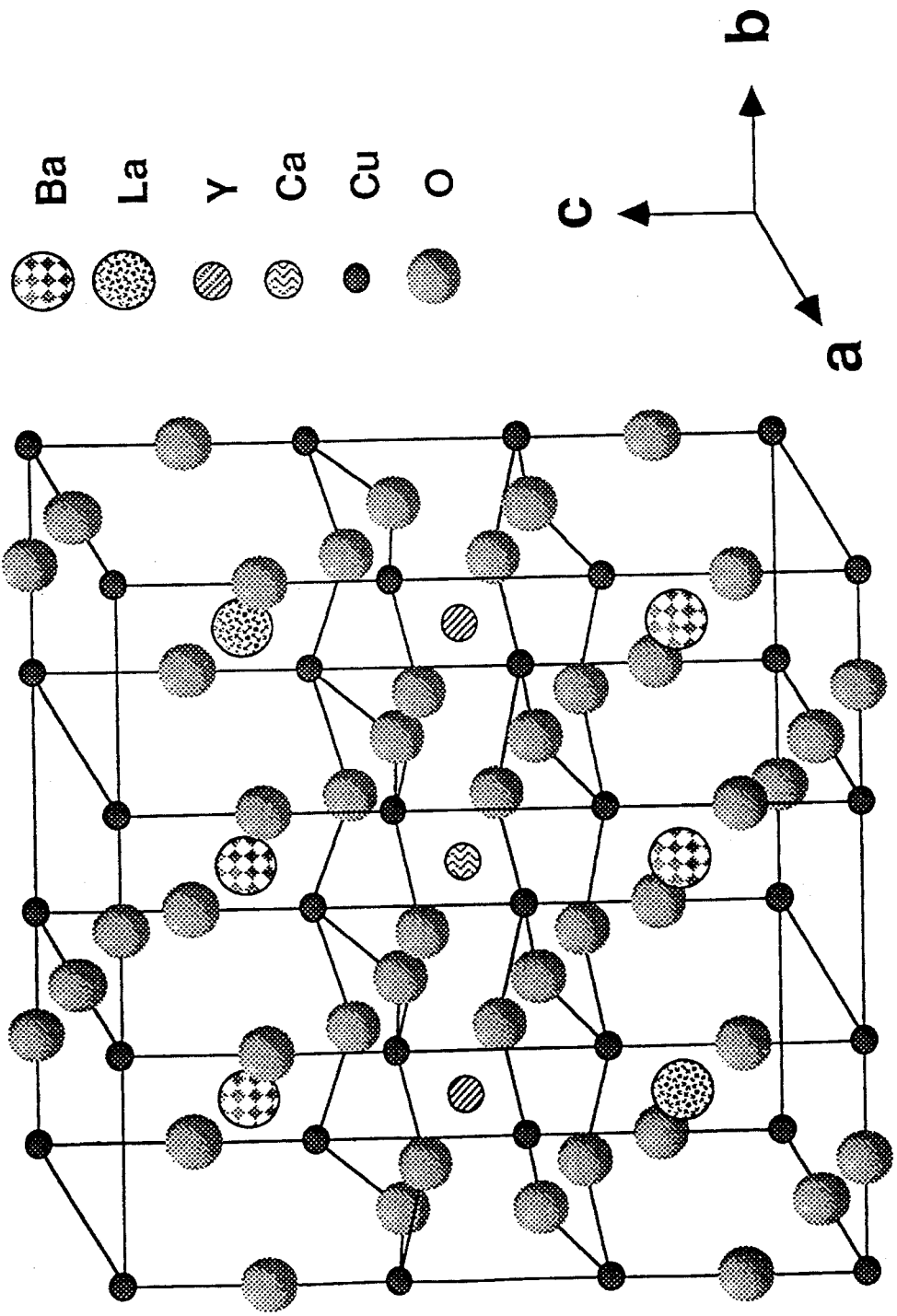
FIG. 2 is a cross-sectional view of the lattice structure of a representative $Y_{1-y}Ca_yBa_{2-y}La_yCu_3O_7$.

Substitution of $La^{3+}$ in $YBa_{2-y}La_yCu_3O_{7-d}$ causes a rapid decrease in $T_C$ due to a disordering of oxygen in the $Cu(1)O_x$ plane and an accompanying transfer of holes from the active $Cu(2)O_2$ sheets to the inactive $Cu(1)O_x$ planes (Manithiram, 1988). However, it is found that cosubstitution of $Ca^{2+}$ for $Y^{3+}$ and $La^{3+}$ for $Ba^{2+}$ in the $Y_{1-y}Ca_yBa_{2-y}La_yCu_3O_{7-d}$ system (FIG. 2) can maintain the $T_C$ above 80 K. (Manthiram, 1989) in spite of the fact that an orthorhombic to tetragonal transition occurs around at y~0.4. The most effective substitution that produce both high transition temperatures and good corrosion resistance have 0.1<y<0.4, preferably 0.3<y<0.4 (see Table 6).

The appropriate limits for preparation of a single phase materials have y≦0.4. Above this level, the impurities are found in the phase assemblage by XRD and neutron diffraction. Some La population of the Y site is thought to occur (Keller-Berest, 1989 and Slater, 1992). In addition, for maintaining the same oxidation state of the constituent ions, in specific, the Cu ions, as in the prototype material, the $Ca^{2+}$ and $La^{3+}$ substitutions must be in approximately the same proportion in the $Y_{1-y}Ca_yBa_{2-y}La_yCu_3O_{7-d}$ system to achieve this situation.

Within the $Y_{1-y}Ca_yBa_{2-y}La_yCu_3O_{7-d}$ class of compounds, the lattice parameter measurements indicate that the orthorhombicity is decreased with increasing degree of substitution. Interestingly, the most stable compound in the series is the tetragonal material, $Y_{0.6}Ca_{0.4}Ba1.6La_{0.4}Cu_3O_{6.96}$ (a=b= 3.869 Å, c=11.622 Å), in which the oxygen ions are disordered in the $Cu(1)O_x$ planes.

For comparison purposes, it is therefore of interest to investigate the influence of substitution of barium with strontium on corrosion resistance. In $YBa_{2-y}Sr_yCu_3O_{7-d}$ system, the appropriate limits of Sr substitution for the isostructural nature of the barium are y≦0.6. Above this level of substitutions, however, it is found that the impurities are formed and $T_c$ begins to be reduced rapidly (Pashin, 1990). Similar to the above mentioned $Y_{1-y}CaYBa_{2-y}LaCu_3O_{7-d}$ system, the corrosion resistance is increased with increasing Sr substitution due to the substitution of Sr for Ba results in reducing the lattice strain. Measurements of the corrosion resistance show that the $YBa_{1.4}Sr_{0.6}Cu_3O_{6.95}$ sample ($T_C$= 85 K.) is at least 5 times more stable than the pristine $YBa_2Cu_3O_{6.96}$ in the aqueous environments (see Table 4).

The dramatic increase in chemical stability in these systems may arise from blocking solution access of protic species into the interior of the superconductor through the removal of the b-axis channels. Alternatively, the release of internal strain and stress factors caused by the chemical substitution reactions may play an important role.

The following examples are included to demonstrate preferred embodiments of the invention. It should be appreciated by those of skill in the art that the techniques disclosed in the examples which follow represent techniques discovered by the inventors to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention.

EXAMPLE 1

Synthesis of Bulk $Y_{1-y}Ca_yBa_{2-y}La_yCu_3O_{7-d}$ Samples

The $Y_{1-y}Ca_yBa_{2-y}La_yCu_3O_{7-d}$ samples have been synthesized by solid state reaction methods. The stoichiometric amounts of metal oxides/carbonates (e.g. 5–10 g) are well-mixed and fired at 900° C. for 15 h. The resulting powders are ground, pelletized and fired at 920° C. for 36 h in oxygen atmosphere with two intermediate grinding and pelletizing steps. The $Y_{1-y}Ca_yBa_{2-y}La_yCu_3O_{7-d}$ pellets (13 mm diameter and 1 mm thickness) are postannealed in $O_2$ at 430° C. for 24 h before phase characterization and corrosion measurements are completed.

EXAMPLE 2

Synthesis of Bulk $YBa_{2-y}Sr_yCu_3O_{7-d}$ Samples

The $YBa_{2-y}Sr_yCu_3O_{7-d}$ samples are prepared using solid state reaction methods. The samples are obtained by firing the metal oxides/carbonates at 900° C. for 15 h (e.g. 5–10 g) and sintering at 925° C. for 24 h in air with one intermediate grinding and pelletizing step. The $YBa_{2-y}Sr_yCu_3O_{7-d}$ pellets (13 mm diameter and 1 mm thickness) are post-annealed in $O_2$ at 430° C. for 24 h. Structures, transition temperatures and lifetimes of representative members of this class of compounds are listed in Table 4.

TABLE 4

Summary of Data for the Sr-substituted $YBa_2CuO_{7-d}$

| Sample | Tc (K) | Structure (O/T) | Lifetime (days) |
|---|---|---|---|
| $YBa_{1.9}Sr_{0.1}Cu_3O_{6.96}$ | 90 | O | 4 |
| $YBa_{1.8}Sr_{0.2}Cu_3O_{6.96}$ | 89 | O | 7 |
| $YBa_{1.6}Sr_{0.4}Cu_3O_{6.96}$ | 87 | O | 7 |
| $YBa_{1.4}Sr_{0.6}Cu_3O_{6.97}$ | 85 | O | 10 |

EXAMPLE 3

Deposition of Thin Films

There are now a number of well established procedures that can be utilized for the deposition of high quality films of high-$T_c$ superconductors. Moreover, as discussed herein, there are a number of possible derivatives of $YBa_2Cu_3O_{7-d}$ that can be prepared with enhanced corrosion resistance properties. In this example, the method of pulsed laser ablation is applied to the deposition of $Y_{0.6}Ca0.4Ba_{1.6}La_{0.4}Cu_3O_{7-d}$ thin films.

Initially, a high density target (i.e. ~90% of the theoretical value) of ~1 inch diameter and ~0.25 thick is prepared using the basic procedure described in Example 1. The target is introduced into a chamber and a base vacuum of ~$10^{-6}$ torr is established initially. Then, ~150 mTorr of oxygen is introduced into the chamber and an excimer laser beam (KrF, 248 nm) is pulsed at −1 Hz onto the surface of the target. The material which is ablated away from target is collected onto a MgO (100) or $LaAlO_3$ (100) substrate which is positioned on a heated platform which is maintained at a temperature close to 800° C. Although, the deposition parameters described here are similar to those reported previously (Dikkamp et al., *Appl. Phys. Lett.*, 51, 619 (1987) for the parent compound, $YBa_2Cu_3O_{7-d}$, a significantly higher deposition temperature is required to produce high quality, c-axis oriented films of $Y_{0.6}Ca_{0.4}Ba_{1.6}La_{0.4}Cu_3O_{7-d}$.

EXAMPLE 4

There are a number of important basic geometries that can be exploited to prepare stabilized high-Tc structures. FIG. 3 provides representative examples of both bulk ceramic and thin film systems. In the simplest forms, the substituted materials are utilized by themselves to prepare monolithic ceramic (FIG. 3a) and monolithic thin film (FIG. 3c) elements. Since some chemical substitutions lead to decreases in the superconducting transition temperature (see Tables 4–6), it may be desirable to use the parent compound with its high $T_c$ value in combination with a protective coating of one of the substituted materials. Encapsulated ceramics (FIG. 3b) or films (FIG. 3d) may be prepared using such a strategy. Finally, in some situations it may be desirable to prepare multilayer or superlattice structures which contain alternating layers of the parent and substituted materials. By adjusting the thickness of each component layer, it is possible to prepare a large number of different samples in which both the corrosion resistance and superconductivity properties are optimized.

Aside from the superlattice structure, all of the geometries illustrated in FIG. 3a–e have been prepared, and characterized carefully (by x-ray powder diffraction, scanning electron microscopy, resistivity vs. temperature, corrosion resistance, etc.). Shown in Table 5 are a summary of representative samples that we have evaluated in this regard. Interestingly, those samples with two components display transport $T_c$ values characteristic of the parent compound, $YBa_2Cu_3O_{7-d}$. These results demonstrate that the parent and substituted materials can be combined into mechanically robust and useful structures. Corrosion resistance measurements completed on the two component systems show that the substituted material can provide an effective barrier against corrosion for the inner high-$T_c$ material.

TABLE 5

Summary of Transition Temperature Data for Various Thin Film and Ceramic Structures

Figure 3A:
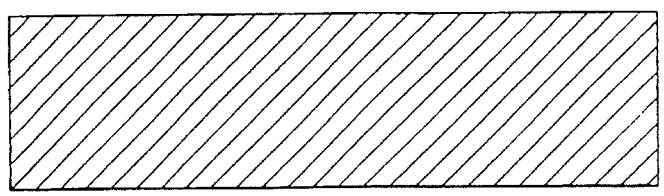
FIG. 3a–3e is a summary of representative structures that may be exploited for the preparation of chemically stable thin film and bulk superconductor structures.
Figure 3B:
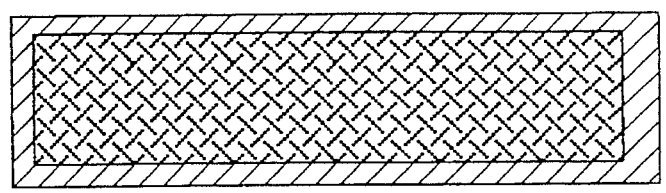
Figure 3C:
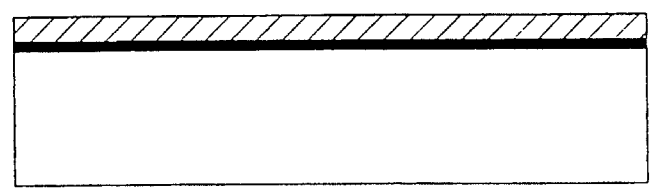
Figure 3D:
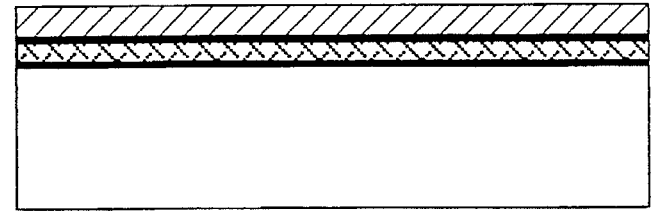
Figure 3E:
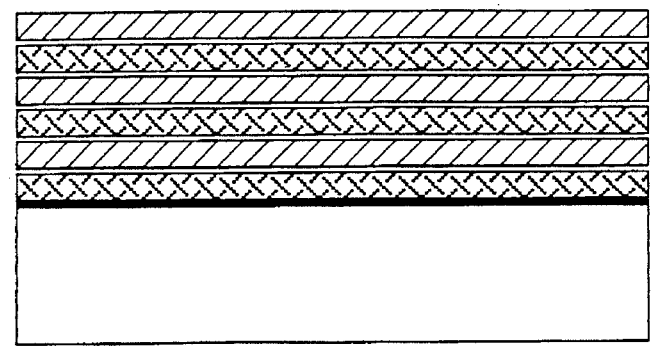

| Components | Sample Type | Structure | Tc |
|---|---|---|---|
| YBCO | bulk | FIG. 3a | 92 |
| Sub-YBCO | bulk | FIG. 3a | 80 |
| YBCO/Sub-YBCO | bulk | FIG. 3b | 92 |
| YBCO | film | FIG. 3c | 90 |
| Sub-YBCO | film | FIG. 3c | 80 |
| YBCO/Sub-YBCO | film | FIG. 3d | 90 |
| YBCO/Sub-YBCO | film | FIG. 3e | — |

YBCO = $YBa_2Cu_3O_{7-d}$
Sub-YBCO = $Y_{0.6}Ca_{0.4}Ba_{1.6}La_{0.4}Cu_3O_{7-d}$

EXAMPLE 5

Figure 4:
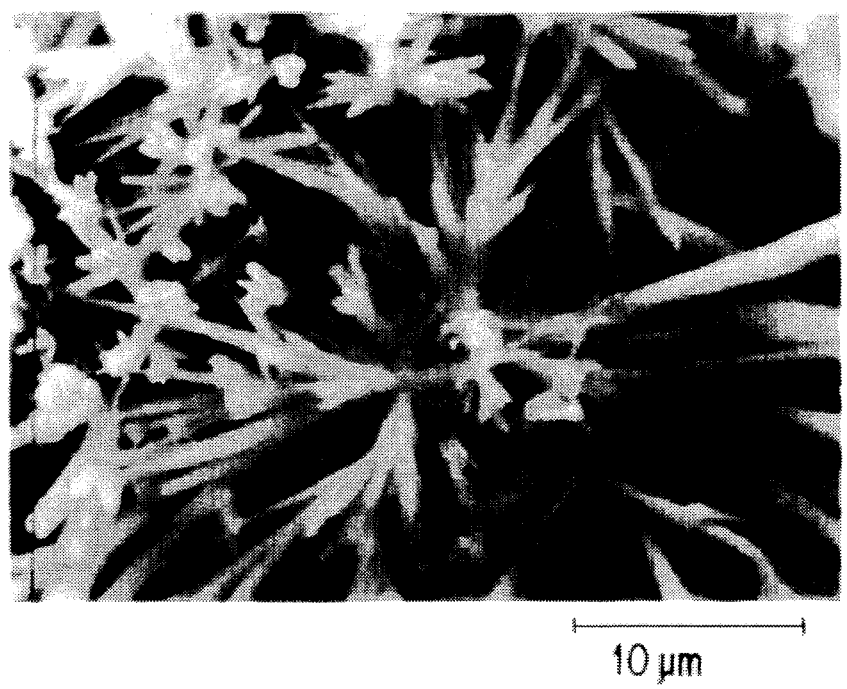
FIG. 4 is a scanning electron micrograph showing a ceramic pellet of $YBa_2Cu_3O_{6.94}$ after its exposure to water solution for 2 days at room temperature.
Figure 5:
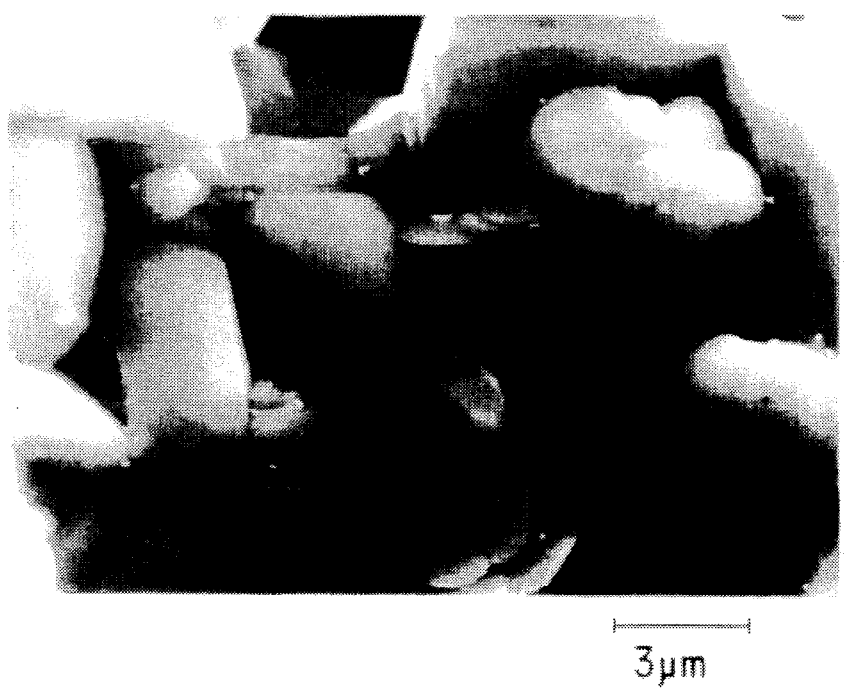
FIG. 5 is a scanning electron micrograph showing a ceramic pellet $Y_{0.6}Ca_{0.4}Ba_{1.6}La_{0.4}Cu_3O_{6.96}$ after 30 days soaking in water at room temperature.

Surface Corrosion Comparison of $YBa_2Cu_3O_{7-d}$ and $Y_{1-y}Ca_yBa_{2-y}La_yCu_3O_{7-d}$ To explore the environmental reactivity characteristics of the substituted compounds, pellet and powder samples were exposed to water at 25° C. and water vapor at 75° C. for various lengths of time. Scanning electron microscopy (SEM) and x-ray powder diffraction (XRD) studies were recorded for the samples before and after the water treatment. Representative results from the SEM study are shown in FIGS. 4 and 5. The unsubstituted pellet sample after exposure to water solution for 2 days (FIG. 4) becomes completely coated with $BaCO_3$ crystallites indicating that the sample has decomposed to a significant extent.

On the other hand, pellet samples of $Y_{0.7}Ca_{0.3}Ba_{1.7}La_{0.3}Cu_3O_{6.95}$ and $Y_{0.6}Ca_{0.4}Ba_{0.6}La_{0.4}Cu_3O_{6.96}$ (FIG. 5) appear to be remarkably stable as almost no reaction with water after one month of exposure is noted. In addition to the electron microscopy results, SQUID, 4-probe conductivity and x-ray powder measurements were obtained before and after the water treatment. All methods demonstrated in a convincing fashion that bulk samples of $Y_{1-y}Ca_yBa_{2-y}La_yCu_3O_{7-d}$ display marked increases in their corrosion resistance as compared to the parent compound. Within the $Y_{1-y}Ca_yBa_{2-y}La_yCu_3O_{7-d}$ series, the corrosion resistance can be enhanced by increasing y up to a level of 0.4, the maximum substitution level capable of generating a single phase high-$T_c$ compound. (Manthiram, 1989) Greater than 100-fold increases in the lifetime of $Y_{0.6}Ca_{0.4}Ba1.6Ca_{0.4}Cu_3O_{6.96}$ as compared to $YBa_2Cu_3O_{6.94}$ are noted as illustrated in Table 6.

TABLE 6

Summary of Data for High-$T_c$ Compounds

| Sample | $T_c$ (K) | Structure[a] (O/T) | Lifetime[b] (days) |
|---|---|---|---|
| $YBa_2Cu_3O_{6.96}$ | 90 | O | 2.0 |
| $YBa_2Cu_3O_{6.59}$ | 60 | O | 4.0 |
| $YBa_2Cu_3O_{6.05}$ | — | T | 0.5 |
| $Y_{0.9}Ca_{0.1}Ba_{1.9}La_{0.1}Cu_3O_{6.97}$ | 85 | O | 5.0 |
| $Y_{0.8}Ca_{0.2}Ba_{1.8}La_{0.2}Cu_3O_{6.96}$ | 83 | O | 10.0 |
| $Y_{0.7}Ca_{0.3}Ba_{1.7}La_{0.3}Cu_3O_{6.95}$ | 80 | O[c] | >80.0 |
| $Y_{0.6}Ca_{0.4}Ba_{1.6}La_{0.4}Cu_3O_{6.96}$ | 80 | T | >150.0 |
| $Gd_{0.6}Ca_{0.4}Ba_{1.6}La_{0.4}Cu_3$ | 84 | T | >150.0 |

[a]Orthorhombic vs. tetragonal crystal symmetry.
[b]Lifetimes were estimated by x-ray diffraction as the sample exposure time necessary to degrade 50% of the high-$T_c$ phase.
[c]This specimen possessed a transitional structure with lattice symmetry intermediate between orthorhombic and tetragonal.

EXAMPLE 6

Thin-film Corrosion

The method of laser ablation was utilized to deposit films of $YBa_2Cu_3O_{7-d}$ and $Y_{0.6}Ca0.4Ba_{1.6}La_{0.4}Cu_3O_{7-d}$ onto MgO (100) substrates as 2000 Å thick films. The typical specimens of this type display transition temperatures of 90 K. and 80 K., respectively.

Figure 6:
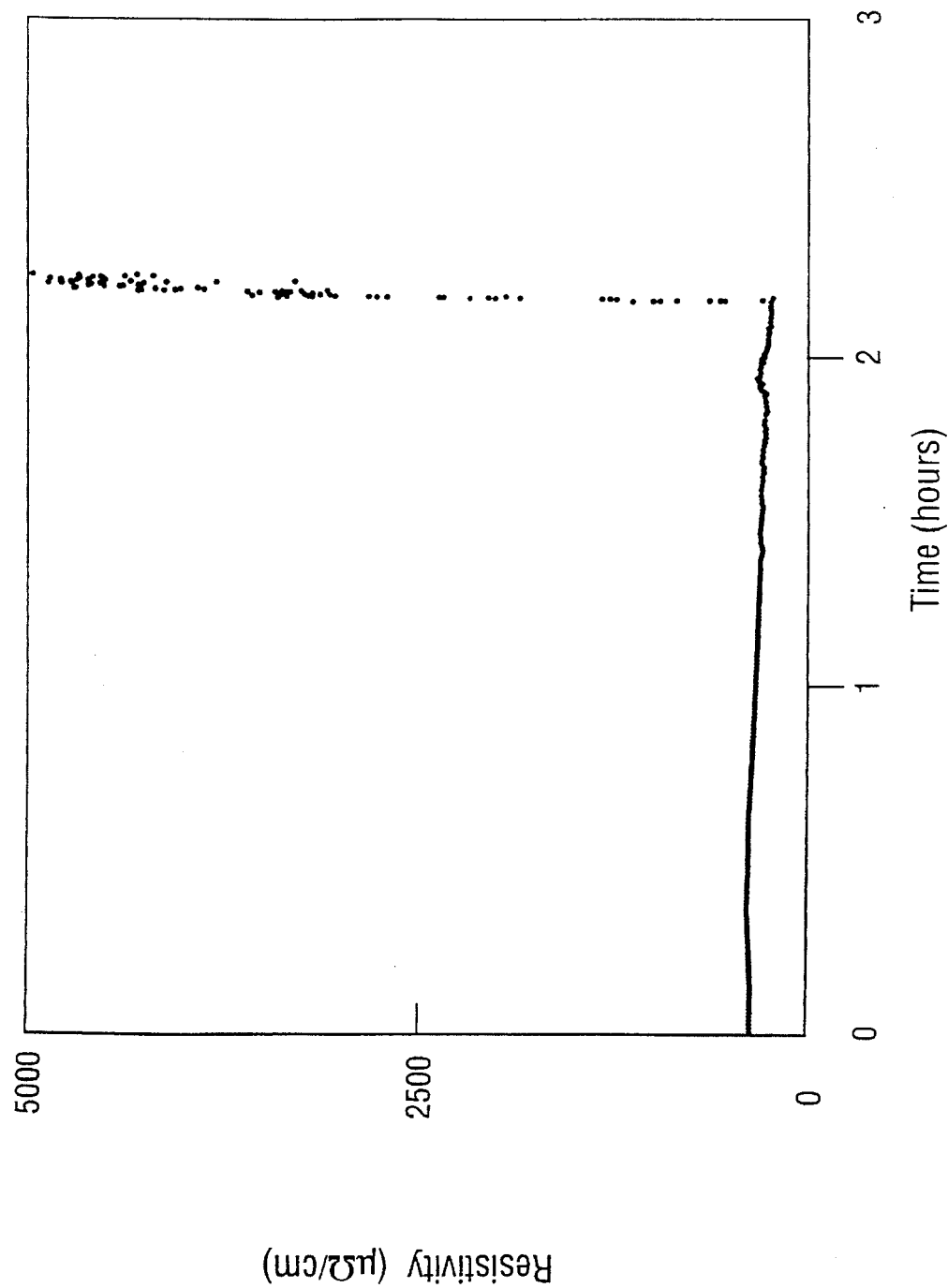
FIG. 6 is a plot of resistivity vs. time for a $YBa_2Cu_3O_{7-d}$ film in 75° C. water vapor showing the degradation which occurs over a period of 2 hours. The film was 2000 Å thick and was supported on a MgO (100) substrate.
Figure 7:
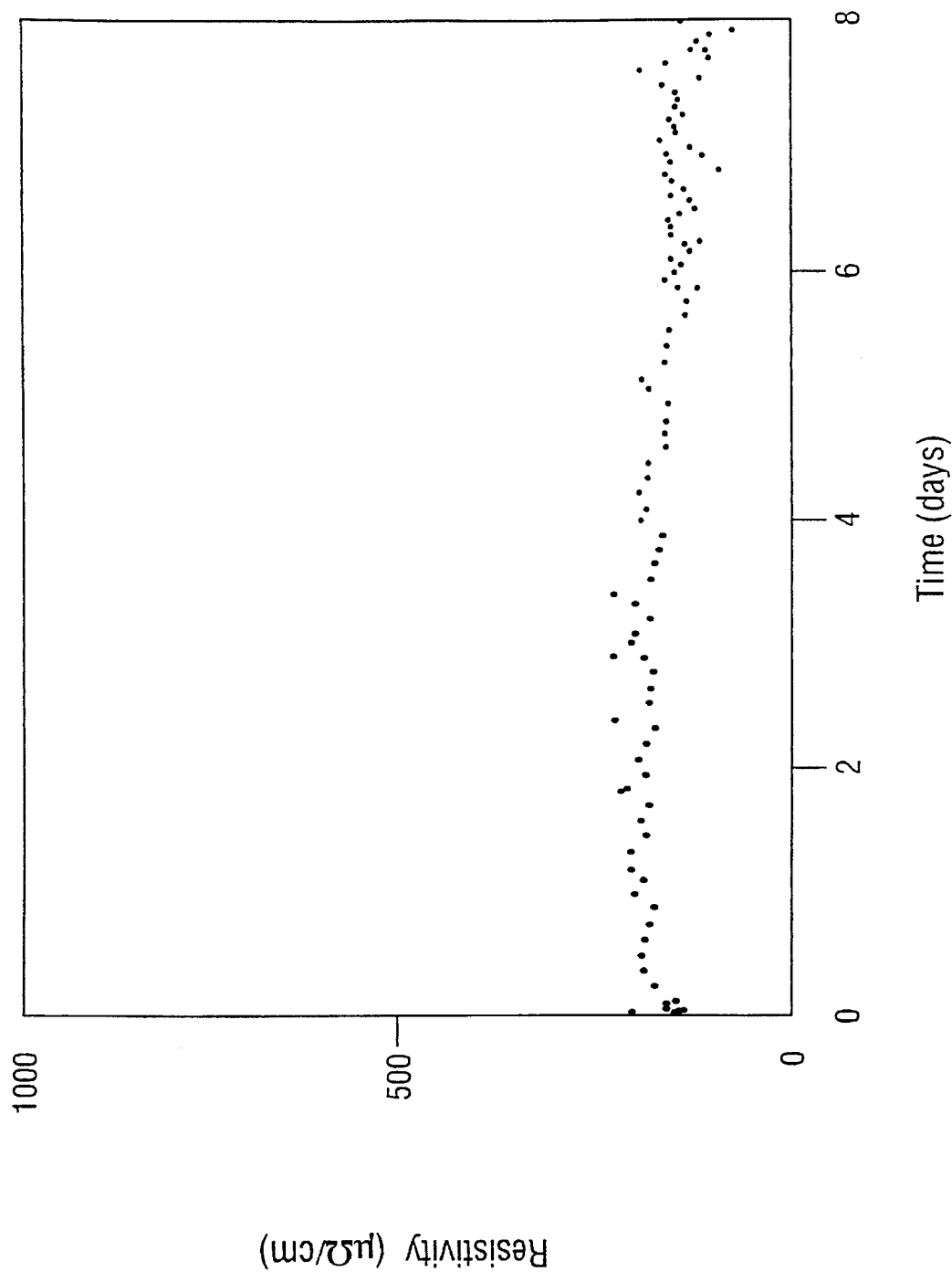
FIG. 7 is a plot of resistivity vs. time for a $Y_{1-y}Ca_yBa_{2-y}La_yCu_3O_{7-d}$ (x=y=0.4) film in same environment which shows little sign of degradation over a period of 8 days. The film was 2000 Å thick and was supported on a MgO (100) substrate.
Figure 8A:
FIG. 8 is an optical photograph showing (a) a $YBa_2Cu_3O_{7-d}$ film and (b) a $Y_{0.6}Ca_{0.4}Ba_{1.6}La_{0.4}Cu_3O_{7-d}$ film after their simultaneous exposure to 75° C. water vapor for 10 days.
Figure 8B:
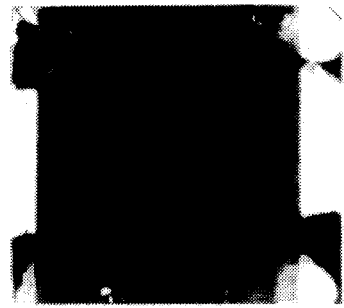

Aside from a few qualitative descriptions of the reactivity of high-$T_c$ films, (Chang, 1988) little quantitative information is currently available in the literature related to the environmental degradation behavior of thin film specimens. To evaluate the reactivity characteristics of the superconductor thin film specimens, resistivity vs. time data was recorded for the two materials as they were simultaneously exposed to water vapor that was equilibrated at 75° C. (FIGS. 6 and 7) In this regard, films of $YBa_2Cu_3O_{7-d}$ degraded rapidly over a period of two hours (FIG. 6). From the physical appearance of the film, it is clear that the passage of current through the superconductor served to strongly accelerate the corrosion processes as seen by selective degradation in the vicinity around the electrodes (FIG. 8a). After stopping the passage of current through the $YBa_2Cu_3O_7$ film, more gradual degradation of the film is noted in regions remote from the contacts (FIG. 8b). On the other hand, the $Y_{0.6}Ca_{0.4}Ba_{1.6}La_{0.4}Cu_3O_{7-d}$ film sample showed very little change in its resistance over a period of 10 days (FIG. 7).

All of the compositions and methods disclosed and claimed herein can be made and executed without undue experimentation in light of the present disclosure. While the compositions and methods of this invention have been described in terms of preferred embodiments, it will be apparent to those of skill in the art that variations may be applied to the composition, methods and in the steps or in the sequence of steps of the method described herein without departing from the concept, spirit and scope of the invention. More specifically, it will be apparent that certain agents which are chemically related may be substituted for the agents described herein while the same or similar results would be achieved. All such similar substitutes and modifications apparent to those skilled in the art are deemed to be within the spirit, scope and concept of the invention as defined by the appended claims.

REFERENCES

The following references, to the extent that they provide exemplary procedural or other details supplementary to those set forth herein, are specifically incorporated in pertinent part herein by reference.

Barkatt, A.; Hojaji, H.; Amarakoon, V. R. W.; Fagan, J. G. MRS *Bulletin*, 1993, 9, 45.
Bedekar, M. M.; Safari, A.; Wilber, W., *Physica C*, 1992, 202, 42.
Black, R. D.; Early, T. A.; Roemer, P. B.; Mueller, O. M.; MogroCampero, A.; Turner, L. G.; Johnson, G. A., *Science*, 1993, 259, 793.
Brown, I. D. *J. Solid State Chem.* 1991, 90, 1952.
Brown, I. D. *Phys. Chem. Mineral.* 1987, 15, 30.
Brown, I. D.; Altermatt, D. *Acta Crystallogr. Sect.* 1985, B41, 244.
Capponi, J. J.; Chailout, C.; Hewat, A. W.; Lijay, P.; Marrezio, M.; Nguyen, N.; Ravear, B.; Sopubeyroux, J. L.; Tholence, J. L.; Tournier, R. *Europhys. Lett.* 1987, 3, 1301.
Chang, C. -A., *Appl. Phys. Lett.* 1988, 53, 111.
Goodenough, J. B.; Manthiram, A. *J. Solid State Chem.* 1991, 92, 231.
Hor, P. H.; Chu, C. W.; et al. *Phys. Rev. Lett.* 1987, 58, 1891.
Huang, Q.; Cava, R. J.; et al. *Physica C* 1992, 193, 196.
Jorgensen, J. D.; Veal, B. W.; Paulikas, A. P.; Nowicki, L. J.; Crabtree, G. W.; Claus, H.; Kwok, W. K. *Phys. Rev. B* 1990, 41, 1863.
Keller-Berest, F.; Megtert, S.; Collin, G.; Monod, P.; Ribaute, M. *Physica C* 1989, 161, 150.
Manthiram, A.; Tang, X. X.; Goodenough, J. B. *Phys. Rev. B* 1988, 37, 3734.
Manthiram, A.; Goodenough, J. B. *Physica C* 1989, 159, 760.
Narita, H.; Hanano, T.; Nakamura, K., *J. Appl. Phys.* 1992, 72, 78.
Nishhara, H.; Kitazawa, K.; et al. *Jap. J. Appl. Phys.* 1988, 27, 1652.
Pashin, S. F.; Antipov, E. V.; Kovba, L. M. *Superconductivity* 1990, 3, 2386.
Rosamilia, J. M.; Miller, B.; Schnemeyer, L. F.; Waszczak, J. V.; O'Bryan, H. M., Jr. *J. Electrochem. Soc.* 1987, 134, 1863.
Slate, P. R.; Greaves, C. *Supercond. Sci. Technol.* 1992, 5, 205.
Sunshine, S. A.; Murphy, D. W.; et al. *Chem. Mater.* 1989, 1, 331.
Thompson, J. G.; Stewart, A. M.; et al. *Mat. Res. Bull.* 1987, 22, 1715.
Yarmoshenko, Y. M.; Ausloss, M.; et al. *Physica C* 1993, 211, 29.
Zhou, J. P.; McDevitt, J. T., *Chem. Mater.* 1992, 4, 953.
Zhou, J. P.; Riley D. R.; Manthiram A.; Arendt M.; Schmerling, M.; McDevitt, J. T. *Appl. Phys. Lett.* 1993, 4, 548.
Zhou, J. P.; Riley, D. R.; McDevitt, J. T. *Chem. Mater.* 1993, 5, 361.
Zhou, J. P.; McDevitt, J. T. *Solid State Comm.* 1993, 86, 11.

What is claimed is:

1. A process for producing corrosion resistant superconductive $YBa_2Cu_3O_7$ material comprising encapsulating said superconductive material with a protective coating of $Y_{1-x}Ca_xBa_{2-y}La_yCu_3O_{7-d}$ where x and y are from about 0.1 to about 1.0 and d is 1 or less than 1.

2. The process of claim 1 where x and y are from about 0.1 to about 0.4 and d is 1 or less than 1.

3. The process of claim 1 where x and y are from 0.3 to 0.4.

4. The process of claim 1 where d is from 0.03 to 1.00.

* * * * *